US 7,316,966 B2

(12) United States Patent
Kurita et al.

(10) Patent No.: US 7,316,966 B2
(45) Date of Patent: Jan. 8, 2008

(54) METHOD FOR TRANSFERRING SUBSTRATES IN A LOAD LOCK CHAMBER

(75) Inventors: Shinichi Kurita, San Jose, CA (US); Wendell T. Blonigan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/278,318

(22) Filed: Mar. 31, 2006

(65) Prior Publication Data

US 2006/0182615 A1    Aug. 17, 2006

Related U.S. Application Data

(62) Division of application No. 09/957,784, filed on Sep. 21, 2001, now Pat. No. 7,105,463.

(51) Int. Cl.
    *H01L 21/20* (2006.01)
(52) U.S. Cl. .................. 438/478; 438/758; 438/795; 257/E21.122
(58) Field of Classification Search .................. 438/46, 438/478, 758, 795, 796
    See application file for complete search history.

(56) References Cited

U.S. PATENT DOCUMENTS

| 3,976,330 | A | 8/1976 | Babinski et al. |
|---|---|---|---|
| 4,047,624 | A | 9/1977 | Dorenbos |
| 4,178,113 | A | 12/1979 | Beaver, II et al. |
| 4,311,542 | A | 1/1982 | Mueller et al. |
| 4,512,391 | A | 4/1985 | Harra |
| 4,680,061 | A | 7/1987 | Lamont, Jr. |
| 4,687,542 | A | 8/1987 | Davis et al. |
| 4,693,777 | A | 9/1987 | Hazano et al. |
| 4,709,655 | A | 12/1987 | Van Mastrigt |
| 4,759,681 | A | 7/1988 | Nogami |
| 4,770,590 | A | 9/1988 | Hugues et al. |
| 4,775,281 | A | 10/1988 | Prentakis |
| 4,785,962 | A | 11/1988 | Toshima |
| 4,801,241 | A | 1/1989 | Zajac et al. |
| 4,816,098 | A | 3/1989 | Davis et al. |
| 4,828,224 | A | 5/1989 | Crabb et al. |
| 4,836,733 | A | 6/1989 | Hertel et al. |

(Continued)

FOREIGN PATENT DOCUMENTS

EP    0 359 525    3/1990

(Continued)

OTHER PUBLICATIONS

EPO Communication dated Nov. 10, 2006, for EP Application No. 01971084.7.

(Continued)

*Primary Examiner*—Wai-Sing Louie
(74) *Attorney, Agent, or Firm*—Patterson & Sheridan, LLP

(57) ABSTRACT

Provided herein is a substrate processing system, which comprises a cassette load station; a load lock chamber; a centrally located transfer chamber; and one or more process chambers located about the periphery of the transfer chamber. The load lock chamber comprises double dual slot load locks constructed at same location. Such system may be used for processing substrates for semiconductor manufacturing.

15 Claims, 8 Drawing Sheets

U.S. PATENT DOCUMENTS

| | | | |
|---|---|---|---|
| 4,846,102 | A | 7/1989 | Ozias |
| 4,857,689 | A | 8/1989 | Lee |
| 4,863,547 | A | 9/1989 | Shidahara et al. |
| 4,870,923 | A | 10/1989 | Sugimoto |
| 4,895,107 | A | 1/1990 | Yano et al. |
| 4,911,103 | A | 3/1990 | Davis et al. |
| 4,913,929 | A | 4/1990 | Moslehi et al. |
| 4,923,584 | A | 5/1990 | Bramhall, Jr. et al. |
| 4,951,601 | A | 8/1990 | Mayden et al. |
| 4,952,299 | A | 8/1990 | Chrisos et al. |
| 4,966,519 | A | 10/1990 | Davis et al. |
| 4,989,543 | A | 2/1991 | Schmitt |
| 4,990,047 | A | 2/1991 | Wagner et al. |
| 5,001,327 | A | 3/1991 | Hirasawa et al. |
| 5,044,871 | A | 9/1991 | Davis et al. |
| 5,060,354 | A | 10/1991 | Chizinsky |
| 5,131,460 | A | 7/1992 | Krueger |
| 5,186,718 | A | 2/1993 | Tepman et al. |
| 5,187,115 | A | 2/1993 | Coleman |
| 5,199,483 | A | 4/1993 | Bahng |
| 5,202,716 | A | 4/1993 | Tateyama et al. |
| 5,224,809 | A | 7/1993 | Maydan et al. |
| 5,227,708 | A | 7/1993 | Lowrance |
| 5,248,370 | A | 9/1993 | Tsui et al. |
| 5,252,807 | A | 10/1993 | Chizinsky |
| 5,254,170 | A | 10/1993 | Devilbiss et al. |
| 5,259,881 | A | 11/1993 | Edwards et al. |
| 5,259,883 | A | 11/1993 | Yamabe et al. |
| 5,261,935 | A | 11/1993 | Ishii et al. |
| 5,288,379 | A | 2/1994 | Namiki et al. |
| 5,292,393 | A | 3/1994 | Maydan et al. |
| 5,352,294 | A | 10/1994 | White et al. |
| 5,355,066 | A | 10/1994 | Lowrance |
| 5,376,212 | A | 12/1994 | Saiki |
| 5,404,894 | A | 4/1995 | Shiraiwa |
| 5,421,889 | A | 6/1995 | Pollock et al. |
| 5,443,346 | A | 8/1995 | Murata et al. |
| 5,445,484 | A | 8/1995 | Kato et al. |
| 5,447,409 | A | 9/1995 | Grunes et al. |
| 5,464,313 | A | 11/1995 | Ohsawa |
| 5,469,035 | A | 11/1995 | Lowrance |
| 5,470,784 | A | 11/1995 | Coleman |
| 5,474,410 | A | 12/1995 | Ozawa et al. |
| 5,512,320 | A | 4/1996 | Turner et al. |
| 5,516,732 | A | 5/1996 | Flegal |
| 5,536,128 | A | 7/1996 | Shimoyashiro et al. |
| 5,562,383 | A | 10/1996 | Iwai et al. |
| 5,570,994 | A | 11/1996 | Somekh et al. |
| 5,586,585 | A | 12/1996 | Bonora et al. |
| 5,588,827 | A | 12/1996 | Muka |
| 5,607,009 | A | 3/1997 | Turner et al. |
| 5,609,689 | A | 3/1997 | Kato et al. |
| 5,611,655 | A | 3/1997 | Fukasawa et al. |
| 5,611,865 | A | 3/1997 | White et al. |
| 5,615,988 | A | 4/1997 | Wiesler et al. |
| 5,616,208 | A | 4/1997 | Lee |
| 5,636,964 | A | 6/1997 | Somekh et al. |
| 5,655,277 | A | 8/1997 | Galdos et al. |
| 5,674,786 | A | 10/1997 | Turner et al. |
| 5,685,684 | A | 11/1997 | Kato et al. |
| 5,695,568 | A | 12/1997 | Sinha et al. |
| 5,697,749 | A | 12/1997 | Iwabuchi et al. |
| 5,700,127 | A | 12/1997 | Harada et al. |
| 5,716,207 | A | 2/1998 | Mishina et al. |
| 5,738,767 | A | 4/1998 | Coad et al. |
| 5,751,003 | A | 5/1998 | Rose et al. |
| 5,784,799 | A | 7/1998 | Kato et al. |
| 5,795,355 | A | 8/1998 | Moran |
| 5,820,679 | A | 10/1998 | Yokoyama et al. |
| 5,833,426 | A | 11/1998 | Marohl |
| 5,855,681 | A | 1/1999 | Maydan et al. |
| 5,855,726 | A | 1/1999 | Soraoka et al. |
| 5,882,165 | A | 3/1999 | Maydan et al. |
| 5,884,009 | A | 3/1999 | Okase |
| 5,891,251 | A | 4/1999 | MacLeish et al. |
| 5,902,088 | A | 5/1999 | Fairbairn et al. |
| 5,909,994 | A | 6/1999 | Blum et al. |
| 5,913,978 | A | 6/1999 | Kato et al. |
| 5,934,856 | A | 8/1999 | Asakawa et al. |
| 5,942,013 | A | 8/1999 | Akimoto |
| 5,944,857 | A | 8/1999 | Edwards et al. |
| 5,951,770 | A | 9/1999 | Perlov et al. |
| 5,954,472 | A | 9/1999 | Hofmeister et al. |
| 5,961,269 | A | 10/1999 | Kroeker |
| 5,997,235 | A | 12/1999 | Hofmeister |
| 6,007,675 | A | 12/1999 | Toshima |
| 6,016,611 | A | 1/2000 | White et al. |
| 6,034,000 | A | 3/2000 | Heyder et al. |
| 6,039,770 | A | 3/2000 | Yang et al. |
| 6,042,623 | A | 3/2000 | Edwards |
| 6,044,534 | A | 4/2000 | Seo et al. |
| 6,048,154 | A | 4/2000 | Wytman |
| 6,059,507 | A | 5/2000 | Adams |
| 6,079,693 | A | 6/2000 | Ettinger et al. |
| 6,082,950 | A | 7/2000 | Altwood et al. |
| 6,086,362 | A | 7/2000 | White et al. |
| 6,106,634 | A | 8/2000 | Ghanayem et al. |
| 6,143,083 | A | 11/2000 | Yonemitsu et al. |
| 6,145,673 | A | 11/2000 | Burrows et al. |
| 6,176,668 | B1 | 1/2001 | Kurita et al. |
| 6,193,507 | B1 | 2/2001 | White et al. |
| 6,206,176 | B1 | 3/2001 | Blonigan |
| 6,213,704 | B1 | 4/2001 | White et al. |
| 6,215,897 | B1 | 4/2001 | Beer et al. |
| 6,224,680 | B1 | 5/2001 | Toshima |
| 6,235,634 | B1 | 5/2001 | White et al. |
| 6,254,328 | B1 | 7/2001 | Wytman |
| 6,270,582 | B1 | 8/2001 | Rivkin et al. |
| 6,286,230 | B1 | 9/2001 | White et al. |
| 6,315,512 | B1 | 11/2001 | Tabrizi et al. |
| 6,318,945 | B1 | 11/2001 | Hofmeister |
| 6,338,626 | B1 * | 1/2002 | Saeki ................... 432/243 |
| 6,340,405 | B2 | 1/2002 | Park |
| 6,382,895 | B1 | 5/2002 | Konishi et al. |
| 6,410,455 | B1 | 6/2002 | Kuribayashi et al. |
| 6,435,868 | B2 | 8/2002 | White et al. |
| 6,450,750 | B1 | 9/2002 | Heyder et al. |
| 6,486,444 | B1 | 11/2002 | Fairbairn et al. |
| 6,503,365 | B1 | 1/2003 | Kim et al. |
| 6,517,303 | B1 | 2/2003 | White et al. |
| 6,558,509 | B2 | 5/2003 | White et al. |
| 6,568,552 | B1 | 5/2003 | Tabrizi et al. |
| 6,568,899 | B1 | 5/2003 | Kuribayashi et al. |
| 6,602,797 | B2 | 8/2003 | Kuribayashi et al. |
| 6,609,869 | B2 | 8/2003 | Aggarwal et al. |
| 6,610,150 | B1 | 8/2003 | Savage et al. |
| 6,647,665 | B1 * | 11/2003 | Tabrizi et al. ............ 49/340 |
| 6,949,143 | B1 | 9/2005 | Kurita et al. |
| 2001/0041120 | A1 | 11/2001 | Hofmeister |
| 2002/0034886 | A1 | 3/2002 | Kurita et al. |
| 2002/0137346 | A1 | 9/2002 | Donaldson et al. |

FOREIGN PATENT DOCUMENTS

| | | | |
|---|---|---|---|
| EP | 0 607 797 | | 7/1994 |
| EP | 0 608 620 | | 8/1994 |
| EP | 0 608 633 | | 8/1994 |
| EP | 0 684 630 | | 11/1995 |
| EP | 0 756 316 | | 1/1997 |
| EP | 0 935 279 | | 8/1999 |
| JP | 64-028933 | | 1/1989 |
| JP | 02-152251 | | 6/1990 |
| JP | 03 136345 | | 6/1991 |
| JP | 03-274746 | | 12/1991 |

| | | |
|---|---|---|
| JP | 04-098848 | 3/1992 |
| JP | 04-240721 | 8/1992 |
| JP | 05-013551 | 1/1993 |
| JP | 05 179447 | 7/1993 |
| JP | 05-283500 | 10/1993 |
| JP | 06-104326 | 4/1994 |
| JP | 06-156624 | 6/1994 |
| JP | 06-163505 | 6/1994 |
| JP | 07 86169 | 3/1995 |
| JP | 07 96169 | 3/1995 |
| JP | 08 264452 | 10/1996 |
| JP | 10 107126 | 4/1998 |
| JP | 00 195925 | 7/2000 |
| WO | WO 97/30465 | 8/1997 |
| WO | WO 99/13504 | 3/1999 |
| WO | WO 99/18603 | 4/1999 |
| WO | WO 99/31714 | 6/1999 |
| WO | WO 99/59928 | 11/1999 |
| WO | WO 99/60609 | 11/1999 |
| WO | WO 99/60610 | 11/1999 |
| WO | WO 99/60611 | 11/1999 |
| WO | WO 99/60612 | 11/1999 |
| WO | WO 99/61350 | 12/1999 |

OTHER PUBLICATIONS

Iscoff, R., "Dry Etching Systems: Gearing Up for Larger Wafers," Semiconductor International, Oct. 1985, pp. 49-60.
Declaration of Thomas B. Brezocsky, dated Jan. 29, 1999.
Office Action dated May 9, 2007 of the counterpart foreign application from Korean Foreign Patent Office.

* cited by examiner

# METHOD FOR TRANSFERRING SUBSTRATES IN A LOAD LOCK CHAMBER

CROSS-REFERENCE TO RELATED APPLICATIONS

This application is a divisional of U.S. patent application Ser. No. 09/957,784, filed Sep. 21, 2001 now U.S. Pat. No. 7,105,463, which claims benefit of U.S. patent application Ser. No. 09/663,862, filed Sep. 15, 2000, now abandoned. Each of the aforementioned related patent applications is herein incorporated by reference.

BACKGROUND OF THE INVENTION

1. Field of the Invention

The present invention relates generally to the fields of semiconductor manufacturing. More specifically, the present invention relates to a semiconductor wafer or glass substrate processing system comprising a double dual slot load lock and uses thereof.

2. Description of the Related Art

The need for greater throughput and yield in the manufacture of semiconductor devices has driven the development and use of more highly automated wafer processing machines. Also, the desire to minimize wafer particulate contamination during processing has led to the use of vacuum load locks and wafer transport mechanisms which operate in vacuum.

In continuous throughput systems, wafers must be introduced into the vacuum chamber through a load lock in order to prevent exposing the vacuum condition in the chamber to the air outside the chamber. When a wafer is to be loaded into the chamber, the inner closure means, such as a sealing plate, is activated to seal the inner side of the opening, and then the outer closure means, such as a sealing door, is opened. Next the door is opened, a wafer is inserted through the opening, and the door is again closed. The load lock chamber now containing the wafer is pumped down to contain an atmosphere compatible with the atmosphere in the processing vacuum chamber, and then the inner sealing plate is moved away from the opening to expose the wafer for processing in the main vacuum chamber. To increase the throughout, some systems employ two load lock chambers so that processing of wafers can continue uninterrupted by a delay caused by the need to open, empty, reload and re-equilibrate a single load lock chamber.

Despite the increased vacuum isolation, the state-of-the-art systems typically have difficulty providing commercially acceptable throughput for high vacuum processes. Presently, typical load lock chambers employ sliding or rotating valves to isolate a single wafer. Such load locks require a pump-down cycle for each wafer processed and thus inhibit throughput. In addition, the load locks are typically in-line devices; that is, wafers pass in a straight line through the load lock. This substantially contributes to the overall width of the wafer processing machine. Furthermore, in the prior art designs, mechanical feedthroughs, which are used to transmit motion through a vacuum seal, have not been adequate to the task of simultaneously operating a load lock valve and indexing an internal wafer cassette.

Therefore, the prior art is deficient in the lack of effective system/means of processing substrates in a high throughput fashion and meanwhile minimizing particulate contamination during processing. Specifically, the prior art is deficient in the lack of a highly automated substrate processing system comprising double dual slot load locks constructed at one body. The present invention fulfills this long-standing need and desire in the art.

SUMMARY OF THE INVENTION

In one aspect of the present invention, there is provided a substrate processing system, which comprises a cassette load station; a load lock chamber; a centrally located transfer chamber; and one or more process chambers located about the periphery of the transfer chamber. In this system, the load lock chamber comprises two dual slot load locks constructed at same location.

In another aspect of the present invention, there is provided a method of processing substrates in the system disclosed herein for semiconductor manufacturing. This method comprises the following steps: first, moving substrates from the cassette load station to the transfer chamber through the load lock chamber; secondly, transferring the substrates from the transfer chamber to the process chambers; thirdly, processing the substrates in the process chambers; and lastly, unloading the processed substrates from the process chambers to the same cassette load station through the same load lock chamber. In this method, one load lock is in a vacuum condition and the other load lock is in an atmospheric/venting condition at the same time.

Other and further aspects, features, and advantages of the present invention will be apparent from the following description of the embodiments of the invention given for the purpose of disclosure.

BRIEF DESCRIPTION OF THE DRAWINGS

So that the manner in which the above recited features, advantages and objects of the invention, as well as others which will become clear, are attained and can be understood in detail, more particular descriptions of the invention, briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE PREFERRED EMBODIMENT

Figure 1:
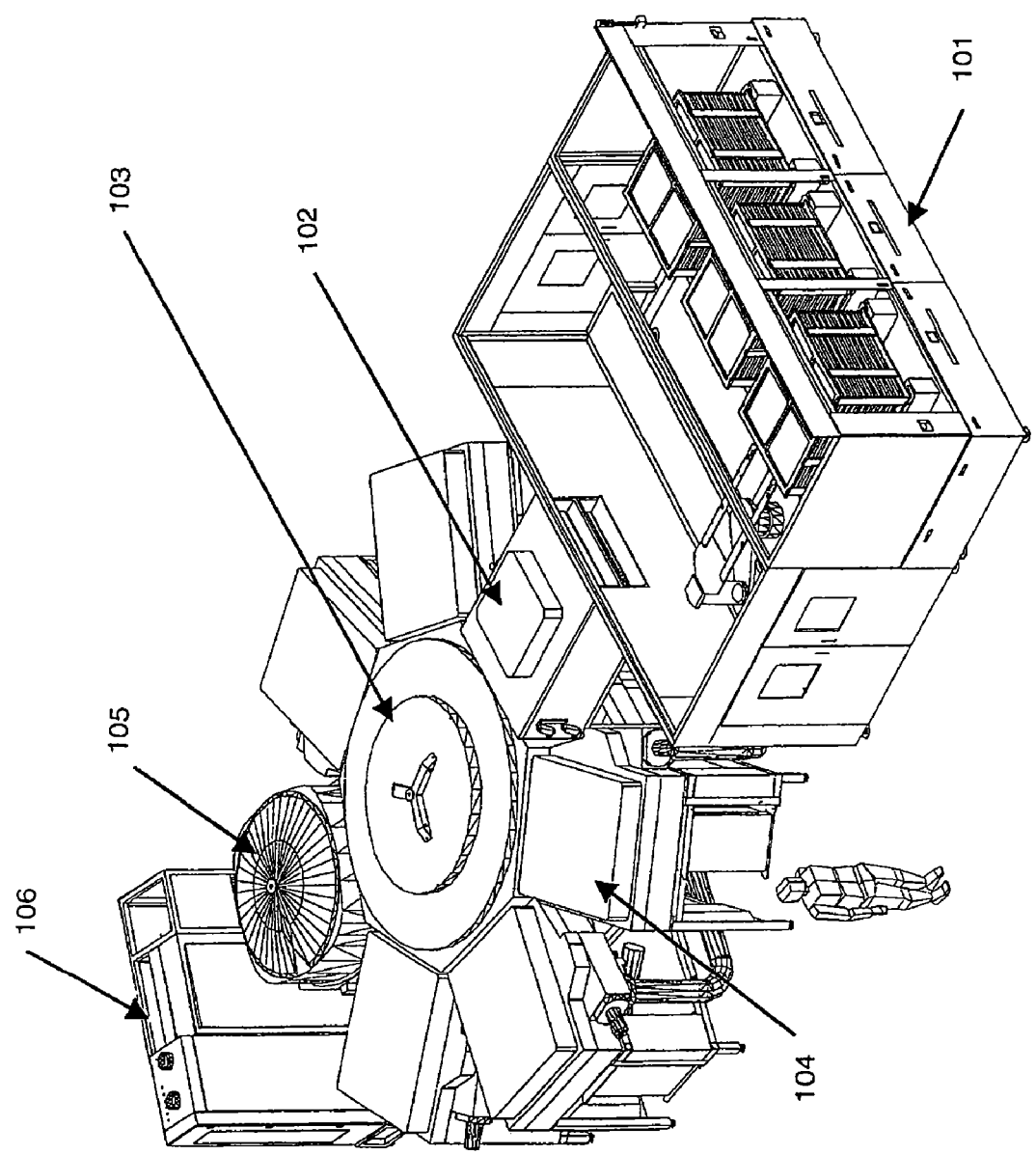
FIG. 1 is an overview of the presently disclosed system, i.e., AKT Gen4 with AGV/MGV interface and atmospheric cassette load station (ACLS), comprising a cassette load station 101, a load lock chamber 102, a central transfer chamber 103, one or more process chambers 104, a heat chamber 105, and control towers and gas chamber 106.

Provided herein is a semiconductor wafer processing system, comprising a cassette load station 101, load lock chamber 102, a central transfer chamber 103, one or more process chambers 104, a heat chamber 105, and control towers and gas chamber 106 (FIG. 1).

Figure 2:
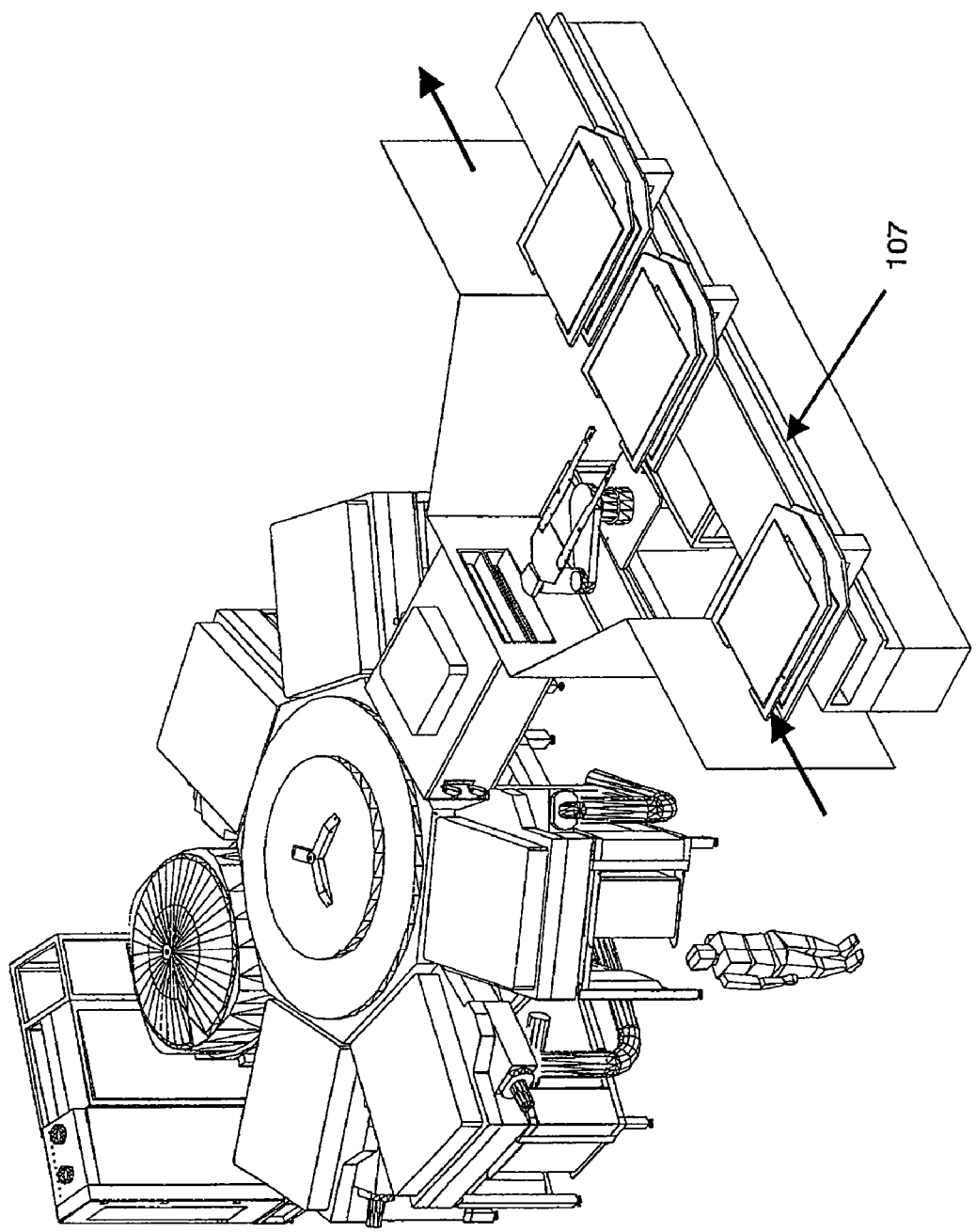
FIG. 2 is an overview of system AKT Gen4 with a substrate transferring link 107.

The load lock chamber 102 is provided for transferring wafers between the transfer chamber 103, which is typically at high vacuum, and the outside, typically a clean room at atmospheric pressure. The central transfer chamber 103 is provided with a vacuum transfer robot located therein for transferring wafers between the load lock chamber 102 and the process chambers 104/heat chamber 105, which are located about the periphery of the transfer chamber 1 03. FIG. 2 is an over view of the system with substrate transferring link 107.

Specifically, the load lock chamber 102 comprises double dual slot load lock constructed at one body (i.e., one location, in one chamber). Each load lock has dual slot load lock (DSL) function: upper slot for loading pre-processed substrate from cassette load station 101 (atmospheric side); and lower slot for unloading processed substrate to cassette load station 101 (atmospheric side). In most cases, the substrate is a wafer or a glass substrate.

Substrates are loaded/unloaded by both vacuum robot and atmospheric robot. Vacuum robot in the central transfer chamber 103 passes substrates through slit valves in the various connected processing chambers 104 or heater chamber 105 and retrieves them after processing in the chambers is complete. Access between the individual process chambers 104 and between the transfer chamber 103 and the load lock chamber 102 is via flip door type slit valves which selectively isolate the process chambers 104 or heat chamber 105 from the robot (in transfer chamber 103) and the robot from the load lock chamber 102. However, the load lock chamber at the atmospheric side may have other than flip door type slit valves. Other doors may also be used to separate the vacuum condition in the load lock chamber from the atmospheric condition outside the chamber.

Figure 3:
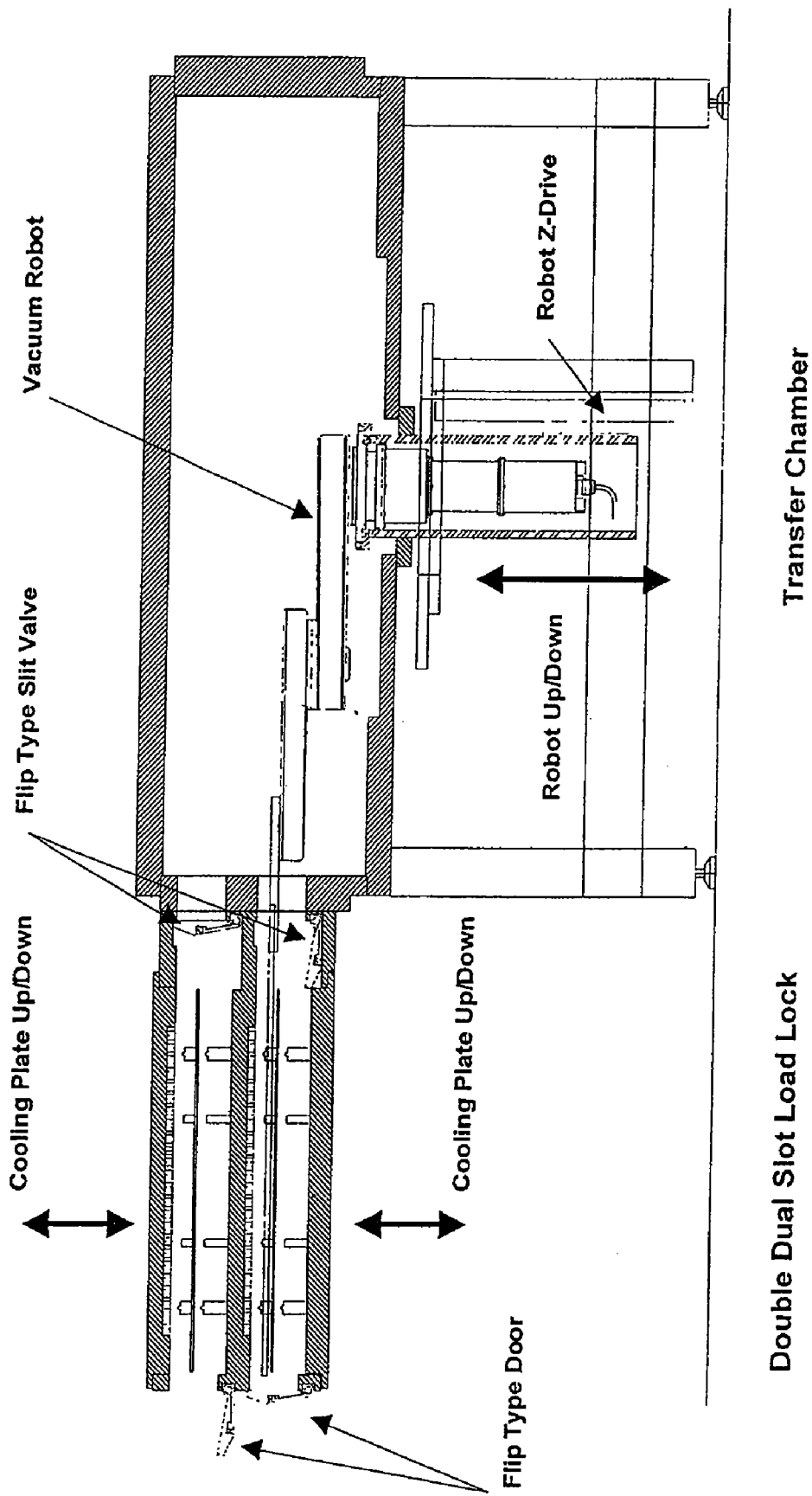
FIG. 3 is a side view of double dual slot load lock and transfer chamber construction in system AKT Gen4.

FIG. 3 is a system side view showing the construction of double dual slot load lock and the transfer chamber. The flip type valve is closed from the atmospheric side, which makes it possible to keep load lock vacuum condition with small torque actuator. The valve is always operated below the substrate transferring plane to reduce particle exposure and opens before loading and unloading of a substrate.

This system configuration permits processing in one or more chambers while wafers are being loaded or unloaded at other process chambers or at the load lock chamber and permits wafer transfer from one processing chamber to another via the transfer chamber. Different processes may be simultaneously performed on different substrates at different process chambers. Each wafer which is dispensed from load lock may be stepped through the same process steps to produce the same type of wafer. Alternatively, different wafers from the same load lock may be programmed to undergo a different "recipe" involving different steps and/or process times, such that different types of wafers are produced.

Specifically, the vacuum robot was operated by Z-drive in an up-and-down motion. The Z-drive shaft is a vacuum seal constructed in chambers with nitrogen purge and vacuum at the same time.

Figure 4:
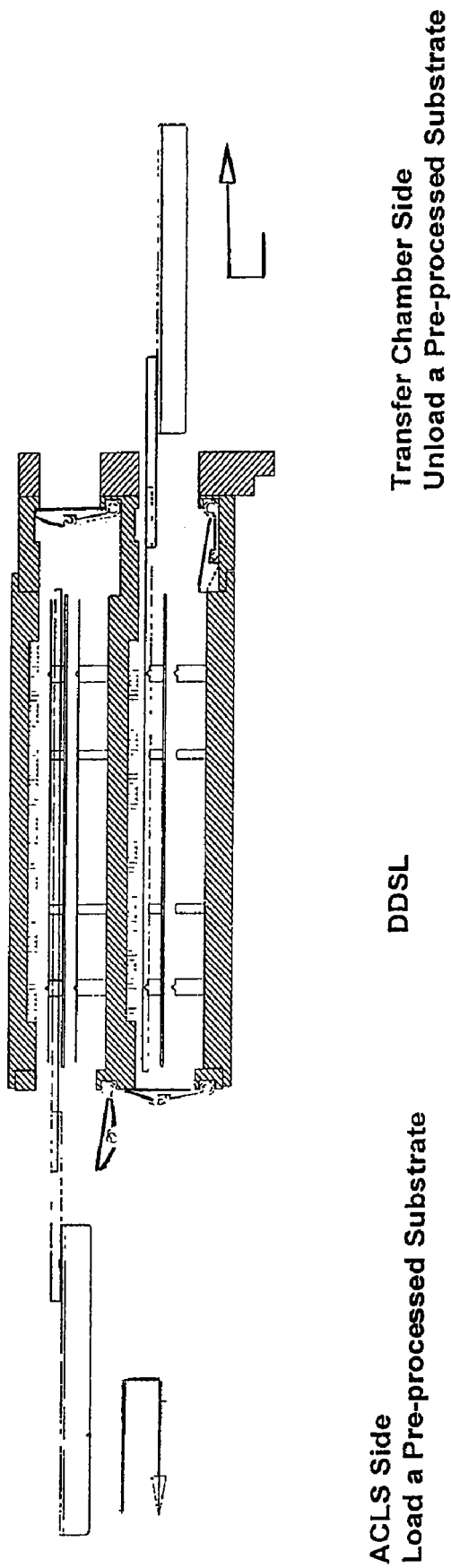
FIG. 4 is a schematic drawing demonstrating loading and unloading of a pre-processed substrate using the double dual slot load lock, wherein the substrate is loaded from ACLS to the upper load lock, and then unloaded to the transfer chamber through the lower load lock.
Figure 5:
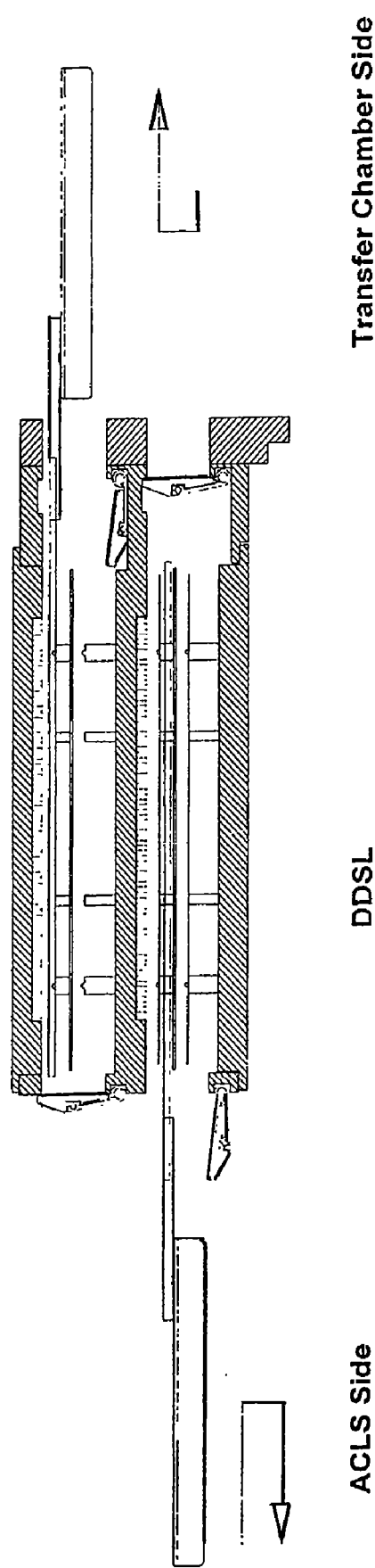
FIG. 5 is a schematic drawing demonstrating loading and unloading of a pre-processed substrate using the double dual slot load lock, wherein the substrate is loaded from ACLS to the lower load lock, and then unloaded to the transfer chamber through the upper load lock.

The above-disclosed system can be used for processing substrates for semiconductor manufacturing. In more specific detail, pre-processed substrates are loaded into the upper slot in one of the load locks from the cassette load station (FIGS. 4-5). The upper slot optionally has a heating plate for heating up the substrates. The heating plate is either a stationary plate or a moving plate. It can approximate to the substrates by Z-drive to increase the heating efficiency. During pumping, the heating temperature can be up to 400° C. The heated substrates are then unloaded from the other load lock to the transfer chamber, and further to the process chambers for processing, or to the heat chamber for either preheating or annealing.

Figure 6:
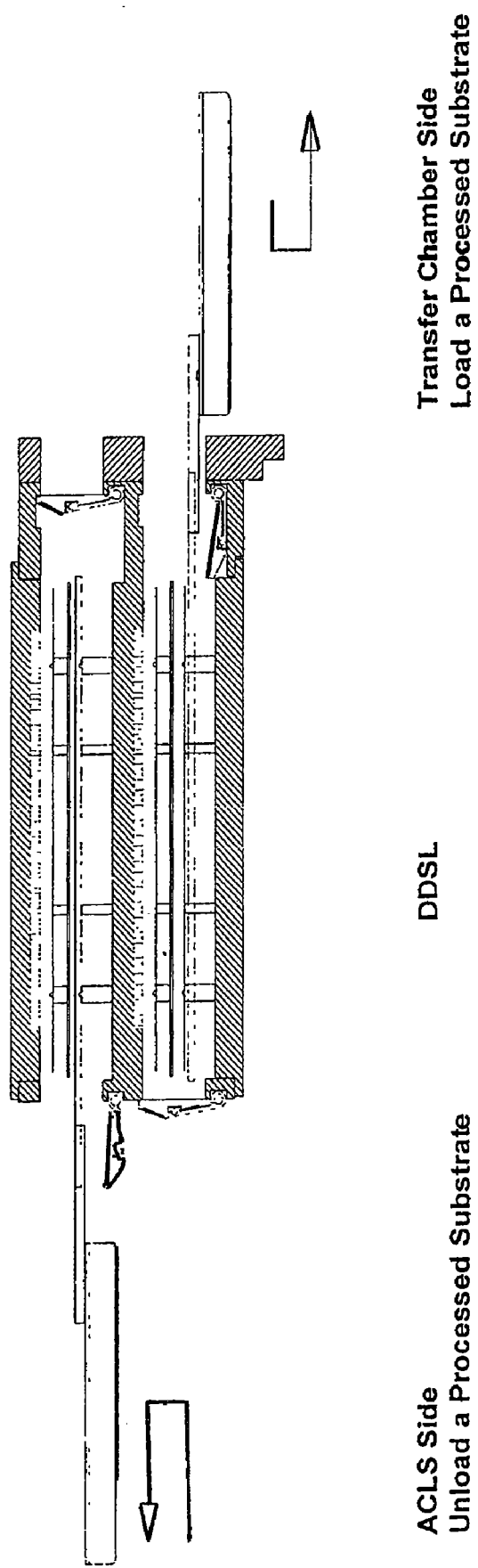
FIG. 6 is a schematic drawing demonstrating loading and unloading of a processed substrate using the double dual slot load lock, wherein the substrate is loaded from the transfer chamber to the lower load lock, and then unloaded to ACLS through the upper load lock.
Figure 7:
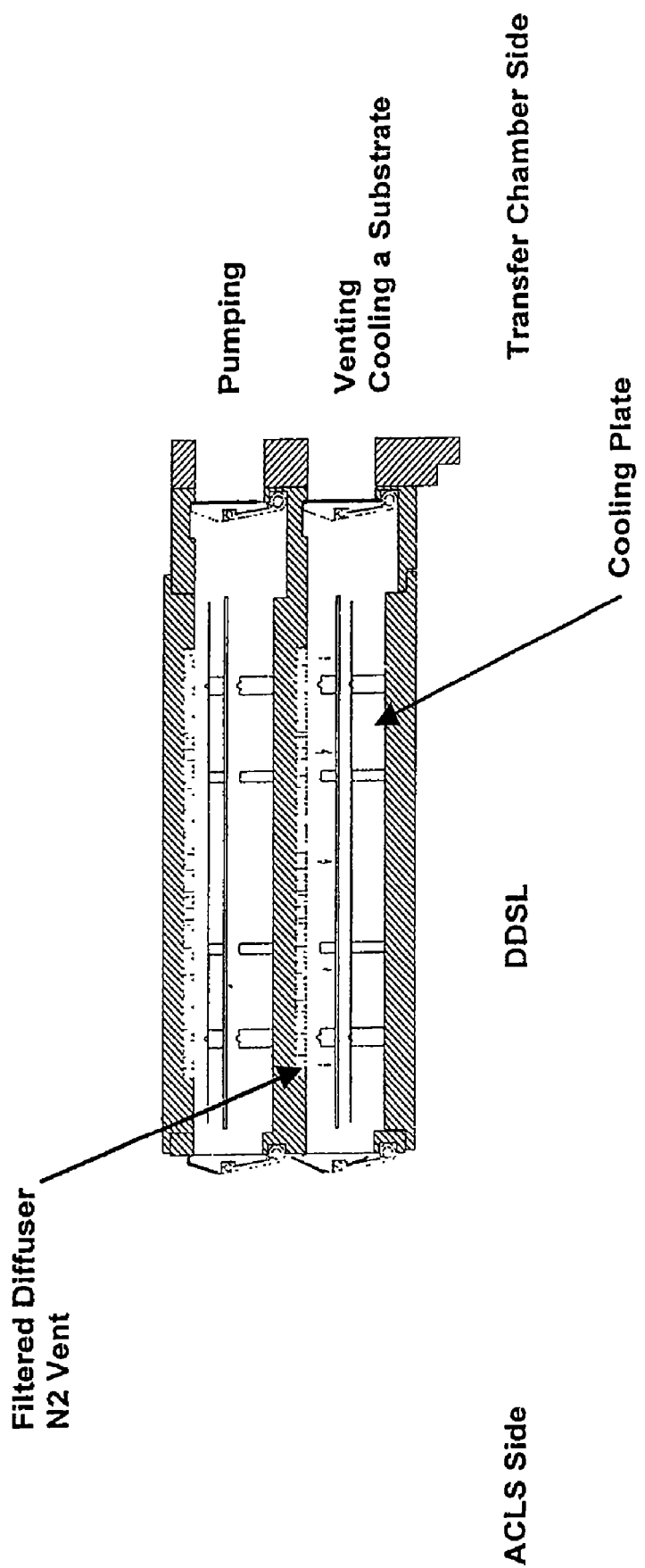
FIG. 7 is a schematic drawing demonstrating pumping and venting processes which take place in the double dual slot load lock. Specifically, filtered diffuser $N_2$ vent is used for cooling a processed substrate when venting.

After processing in the chambers is complete, the processed substrates are then unloaded from the lower slot in one of the load locks to the cassette load station (FIG. 6). Lower slot has a cooling plate for cooling down the processed substrates. The cooling plate is either a stationary plate or moving plate and it can approximate to the substrates by Z-drive to increase the cooling efficiency. Also, a small amount of helium gas (He) can be supplied with nitrogen gas ($N_2$) for cooling. Filtered diffuser $N_2$ vent is used to prevent particle generation in the load locks (FIG. 7). During venting, the temperature can be cooled down from 350° C. to 80° C. When operated, each load lock loads and unloads substrates separately. Normally, one is venting and the other is pumping so that the vacuum pump can be shared between the two load locks.

Figure 8:
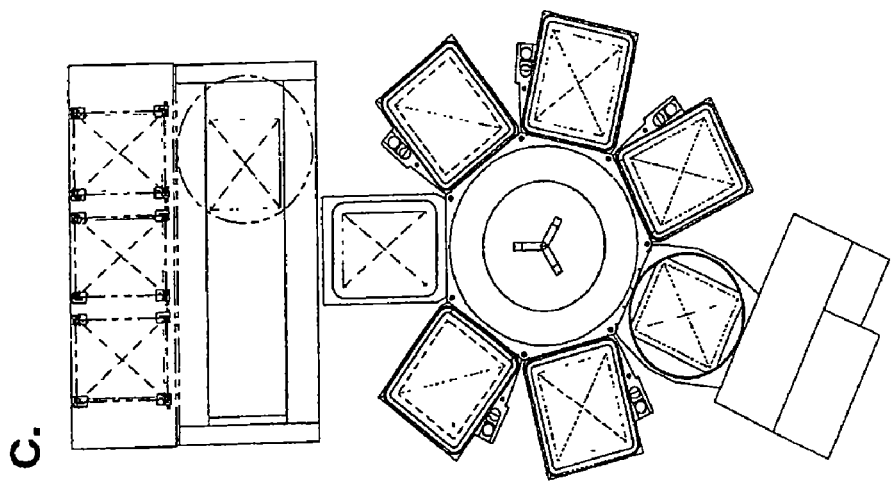
FIGS. 8A-8C show system size comparison among AKT5500 (state-of art system) (Figure A), AKT stretch (Figure B), and AKT Gen4 (Figure C). The AKT stretch is 133% stretch of AKT5500 and a traditional approach to AKT Gen4. Both AKT5500 and AKT stretch have two dual slot load locks which are constructed at two locations, whereas AKT Gen4 has one double dual slot load lock.
Figure 8:
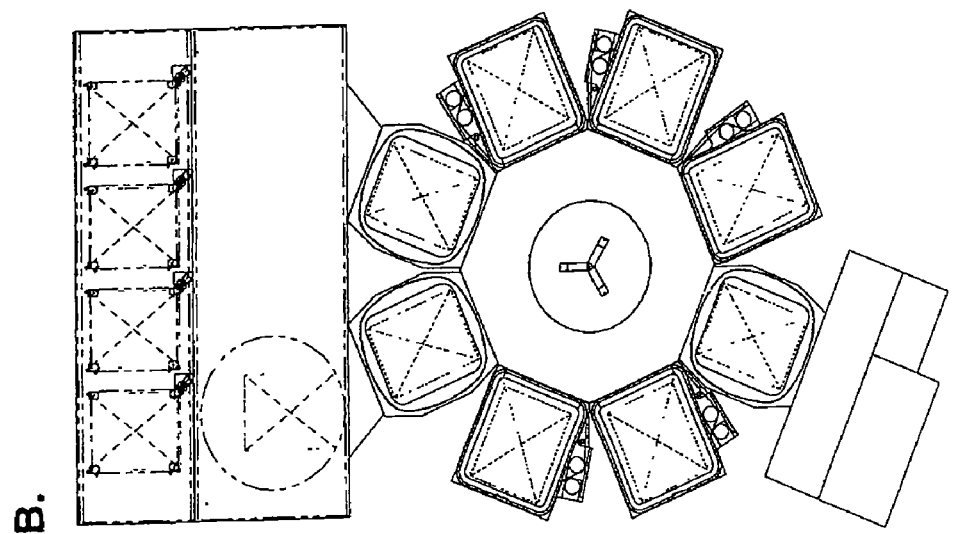
Figure 8:
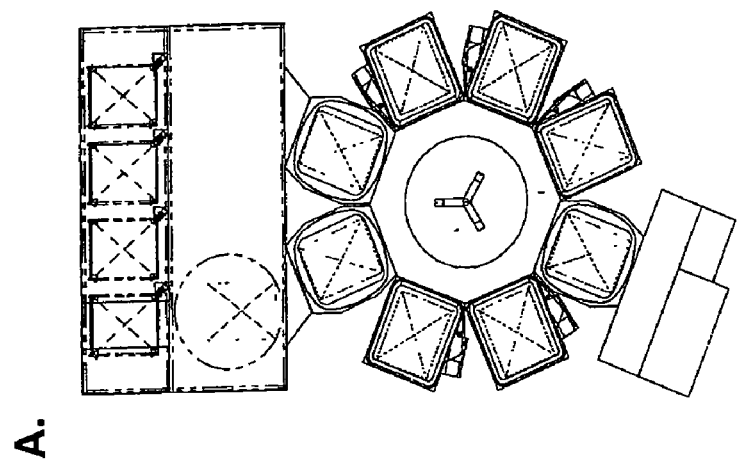

The double dual slot load lock (DDSL) system disclosed herein provides several advantages in comparison with traditional one DSL system, such as AKT5500 or AKT stretch (FIGS. 8A-8C). First, constructing two dual slot load lock at one body (one location) can increase system cost performance, i.e., minimize system footprint and increase system throughput that was restricted by the load lock pumping/venting activity. For a traditional one dual slot load lock system (with 4 process chambers), the system maximum throughput determined by the load lock activity is approximately 30 substrate/hour. In contrast, for one embodiment of the double dual slot load lock system disclosed herein, the system maximum throughput is approximately 60 substrate/hour. For example, a single layer firm (passivation) process has a throughput of approximately 26 substrate/hour for traditional one DSL system, while for one embodiment of the double dual slot load lock system disclosed herein, the passivation process has a throughput of approximately 50 substrate/hour. Since the throughput is restricted by load lock activity, a traditional one DSL system with 3 process chambers has the same throughput as the one with 4 process chambers. For active layer process, a traditional one DSL system (with 4 process chambers) has a throughput of approximately 18 substrate/hour, the same as for one embodiment of the double dual slot load lock system disclosed herein. In this case, the system throughput is the same for both one and double DSL systems, therefore system can use one of the two dual slot load lock. Most customers prefer a system that is capable of switching the process based on the production situation, therefore the system has to be configured to handle quick process. For example, the system can be configured to have shorter process time, or change process time based on process data.

Another advantage of using the presently disclosed double dual slot load lock system is its compact size. The double dual slot load lock system requires narrower atmospheric cassette load station than two DSL systems. For grand transportation, there is an equipment size limitation of approximate 3.0 m in dimension. In one embodiment of the double dual slot load lock system, the transfer chamber is designed in a shape of heptagon and the maximum process chamber quantity is 5. To meet the same size requirement, for two DSL systems, the maximum process chamber quantity would be 3.

Therefore, a substrate processing system is hereby provided, which comprises a cassette load station, a load lock chamber, a transfer chamber, and one or more process chambers. The transfer chamber is centrally located, and the multiple process chambers are located about the periphery of the transfer chamber. The load lock chamber comprises two dual slot load lock constructed at one location.

Specifically, each dual slot load lock has a heating plate and a cooling plate located in different slots. The heating plate is a stationary plate or moving plate operated by Z-drive, and can heat the temperature up to 400° C. during pumping. Similarly, the cooling plate is a stationary plate or moving plate operated by Z-drive, and can cool the temperature down from about 350° C. to about 80° C. during venting. More specifically, the cooling is achieved by water or by venting using nitrogen gas mixed with helium.

The substrate processing system described herein may further comprise a vacuum robot, which is located in the transfer chamber for transferring substrates. The vacuum robot is operated by Z-drive. Still, the system may further comprise a flip type door located between the cassette load station and the load lock chamber. Flip type slit valves may also be constructed between the load lock chamber and the transfer chamber. Such slit valves are closed from atmospheric side and always operated below substrate transferring plane to reduce particle exposure. Still yet, the substrate processing system may further comprise filter diffusers, which are located in the both dual slot load locks to prevent particle generation.

Further provided is a method of processing substrates using the above-disclosed system for semiconductor manufacturing. This method comprises the steps of moving substrates from the cassette load station to the transfer chamber through the load lock chamber; transferring the substrates from the transfer chamber to the process chambers; processing the substrates in the process chambers; and unloading the processed substrates from the process chambers to the cassette load station through the load lock chamber. In this method, one of the dual slot load locks is in a vacuum condition for unloading preprocessed substrates from the load lock chamber to the transfer chamber, whereas at the same time the other dual slot load lock is in an atmospheric condition for unloading processed substrates from the load lock chamber to the cassette load station.

Furthermore, the pre-processed substrates are heated up to about 400° C. before loading to the transfer chamber. The heated substrates are then transferred to the transfer chamber by a vacuum robot which is driven by Z-drive. After processing, the processed substrates are cooled down from about 350° C. to about 80° C. before loading to the cassette load station. To increase cooling efficiency, a small amount of helium gas is supplied with nitrogen gas. Alternatively, the cooling can be achieved by water.

In this method, one load lock is in a vacuum condition and at the same time, the other load lock is in an atmospheric/venting condition. One vacuum pump is shared between the two load locks. Additionally, filter diffusers are located on both load locks to prevent particle generation. Increased vent speed may also be used to further prevent particle generation.

The system/method disclosed herein provides an improved wafer support and transport means to enable automatic and repetitive moving of individual wafers into and from load locks into, through and between processing chambers while minimizing damage and contamination of wafers. Additionally, using two dual slot load lock constructed in the same chamber increases system cost performance, i.e., minimizes system footprint and increases system throughput that was restricted by the load lock pumping/venting activity.

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of processing substrates in a process system to improve throughput thereof, comprising:

moving a first substrate from an atmospheric cassette load station through a stationary load lock chamber to a transfer chamber, said stationary load lock chamber comprising:

two load lock regions disposed in a vertical relationship each load lock region comprising two substrate slots and a movable temperature regulating device;

wherein said first substrate is moved from the atmospheric cassette load station into a first substrate slot of one of the load lock regions and a second substrate is moved from a second substrate slot of said one of the load lock regions to the atmospheric cassette load station, said first substrate subsequently moved to said transfer chamber when said one of the load lock regions is in a vacuum condition for said unloading;

moving said first substrate from said transfer chamber to one or more process chambers located about the periphery of said transfer chamber;

processing said first substrate in said one or more process chambers;

moving said first substrate from the one or more process chambers to said atmospheric cassette load station through said load lock chamber; and moving the temperature regulating device within at least one of the substrate slots.

2. The method of claim 1, further comprising heating said first substrate on one of the substrate slots in said one of the load lock regions prior to moving said first substrate to said transfer chamber.

3. The method of claim 1, further comprising cooling said second substrate on one of the substrate slots in the load lock chamber prior to moving said second substrate to said atmospheric cassette load station.

4. The method of claim 1, further comprising heating the first substrate on one of the substrate slots prior to moving the first substrate to the transfer chamber and cooling the second substrate on another one of the substrate slots prior to moving the second substrate to the atmospheric cassette load station.

5. The method of claim 4, wherein cooling the second substrate further comprises:
moving the temperature regulating device adjacent the second substrate.

6. The method of claim 1 further comprising:
heating at least one of the substrates with the temperature regulating device.

7. A method of processing substrates in a process system to improve throughput thereof, comprising:
moving a first substrate from an atmospheric cassette load station through a stationary load lock chamber to a vacuum chamber, said stationary load lock chamber comprising:
two load lock regions disposed in a vertical relationship, each load lock region comprising two substrate slots temperature regulating device;
wherein said first substrate is moved from the atmospheric cassette load station into a first substrate slot of one of the load lock regions and a second substrate is moved from a second substrate slot of said one of the load lock regions to the atmospheric cassette load station, and said first substrate is subsequently moved from said first substrate slot of said one of said load lock regions to said vacuum chamber and a third substrate is moved from said vacuum chamber to said second substrate slot of said one of the load lock regions, when said one of the load lock regions is in a vacuum condition, and wherein the movable temperature regulating device in moved proximate at least one of the first, second, or third substrates.

8. The method of claim 7, further comprising heating said first substrate on said first substrate slot of said one of the load lock regions prior to moving said first substrate to said vacuum chamber.

9. The method of claim 7, further comprising cooling said second substrate on said second substrate slot of said one of the load lock regions prior to moving said second substrate to said atmospheric cassette load station.

10. The method of claim 8, further comprising cooling said third substrate on said second substrate slot of said one of the load lock regions.

11. The method of claim 8, wherein cooling said second substrate on said second substrate slot further comprises:
moving the temperature regulating device proximate the second substrate.

12. The method of claim 7 further comprising:
heating at least one of the substrates with the temperature regulating device.

13. The method of claim 11 further comprising:
moving the temperature regulating device proximate the heated substrate.

14. The method of claim 7 further comprising:
cooling at least one of the substrates with the temperature regulating device.

15. The method of claim 11 further comprising:
moving the temperature regulating device proximate the cooled substrate.

* * * * *